United States Patent
Chandra et al.

(10) Patent No.: US 10,591,531 B2
(45) Date of Patent: Mar. 17, 2020

(54) METHOD AND APPARATUS FOR INTEGRATED CIRCUIT MONITORING AND PREVENTION OF ELECTROMIGRATION FAILURE

(71) Applicant: QUALCOMM Incorporated, San Diego, CA (US)

(72) Inventors: Rajit Chandra, San Diego, CA (US); Melika Roshandell, Carlsbad, CA (US); Niladri Mojumder, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 63 days.

(21) Appl. No.: 15/177,964

(22) Filed: Jun. 9, 2016

(65) Prior Publication Data

US 2016/0363623 A1 Dec. 15, 2016

Related U.S. Application Data

(60) Provisional application No. 62/173,852, filed on Jun. 10, 2015.

(51) Int. Cl.
*G01R 31/28* (2006.01)

(52) U.S. Cl.
CPC ..... *G01R 31/2853* (2013.01); *G01R 31/2837* (2013.01); *G01R 31/2858* (2013.01)

(58) Field of Classification Search
None
See application file for complete search history.

(56) References Cited

U.S. PATENT DOCUMENTS 5,171,091 A * 12/1992 Kruger ............... G01K 1/026
374/166
5,291,142 A 3/1994 Ohmi
(Continued)

FOREIGN PATENT DOCUMENTS

CN 101923124 A 12/2010
CN 102955121 A 3/2013
(Continued)

OTHER PUBLICATIONS

Wang. T., et al., "Multi-site On-chip Current Sensor for Electromigration Monitoring", IEEE 54th International Midwest Symposium on Circuits and Systems (MWSCAS), 2011, Seoul, Aug. 7-10, 2011, pp. 1-4.
(Continued)

*Primary Examiner* — Paresh Patel
(74) *Attorney, Agent, or Firm* — Arent Fox, LLP (57) ABSTRACT

An apparatus is disclosed. The apparatus includes a circuit, a conductor interconnecting a portion of the circuit, and a processor configured to determine a temperature of the conductor and adjust at least one parameter related to the conductor in response to the determined temperature rising above a threshold. The at least one parameter includes a lifetime estimate for the conductor. A method of operating an apparatus including a circuit and a conductor interconnecting a portion of the circuit is disclosed. The method includes determining a temperature of the conductor, and adjusting at least one parameter related to the conductor in response to the determined temperature rising above a threshold. The parameter includes a lifetime estimate for the conductor.

24 Claims, 10 Drawing Sheets

(56) References Cited

U.S. PATENT DOCUMENTS

| | | | |
|---|---|---|---|
| 5,497,076 A * | 3/1996 | Kuo | G01R 31/2831 324/719 |
| 5,497,079 A | 3/1996 | Yamada et al. | |
| 5,554,938 A * | 9/1996 | Ohmi | G01R 27/02 165/80.2 |
| 5,708,336 A * | 1/1998 | Eyerly | H02H 7/0852 318/436 |
| 6,350,626 B1 * | 2/2002 | Cheng | G01R 31/2642 438/14 |
| 6,867,056 B1 * | 3/2005 | Hau-Riege | H01L 22/34 324/71.1 |
| 7,146,588 B1 * | 12/2006 | Marathe | G01R 31/2858 702/117 |
| 7,394,273 B2 | 7/2008 | Hsu et al. | |
| 7,408,374 B2 | 8/2008 | Cranford et al. | |
| 8,159,814 B2 | 4/2012 | Wang et al. | |
| 8,321,157 B2 * | 11/2012 | Omori | G01R 31/2849 324/537 |
| 8,890,556 B2 | 11/2014 | Chen et al. | |
| 2003/0080761 A1 * | 5/2003 | Filippi, Jr. | H01L 22/34 324/719 |
| 2004/0051553 A1 * | 3/2004 | Manna | G01R 31/129 324/762.02 |
| 2007/0039934 A1 | 2/2007 | Enyedy et al. | |
| 2007/0040696 A1 | 2/2007 | Mubaslat et al. | |
| 2008/0098270 A1 * | 4/2008 | De Ceuninck | G01R 31/2856 714/738 |
| 2013/0003438 A1 | 1/2013 | Merkel et al. | |
| 2013/0212544 A1 * | 8/2013 | Yu | G06F 17/5081 716/55 |
| 2014/0125366 A1 * | 5/2014 | Thogersen | G01R 31/2642 324/750.03 |
| 2014/0232428 A1 | 8/2014 | Chen et al. | |
| 2014/0278247 A1 | 9/2014 | Hutcheon et al. | |

FOREIGN PATENT DOCUMENTS

| | | |
|---|---|---|
| CN | 103063995 A | 4/2013 |
| CN | 103823172 A | 5/2014 |
| JP | S6074183 A | 4/1985 |
| JP | H06342027 A | 12/1994 |
| WO | 0226559 A1 | 4/2002 |

OTHER PUBLICATIONS

Lu Z., et al., "Interconnect Lifetime Prediction for Reliability-Aware Systems", IEEE Transactions on Very Large Scale Integration (VLSI) Systems, IEEE Service Center, Piscataway, NJ, USA, vol. 15, No. 2, Feb. 1, 2007 (Feb. 1, 2007), p. 159-172, XP011176231, ISSN: 1063-8210. DOI: 10.1109/TVLSI.2007.893578 the whole document.

Partial International Search Report—PCT/US2016/036844—ISA/EPO—dated Sep. 1, 2016.

International Search Report and Written Opinion—PCT/US2016/036844—ISA/EPO—dated Nov. 28, 2016.

\* cited by examiner

METHOD AND APPARATUS FOR INTEGRATED CIRCUIT MONITORING AND PREVENTION OF ELECTROMIGRATION FAILURE

CROSS-REFERENCE TO RELATED APPLICATION(S)

This application claims the benefit of U.S. Provisional Application Ser. No. 62/173,852, entitled "METHOD AND APPARATUS FOR INTEGRATED CIRCUIT MONITORING AND PREVENTION OF ELECTROMIGRATION FAILURE" and filed on Jun. 10, 2015, which is expressly incorporated by reference herein in its entirety.

BACKGROUND

Field

The disclosure relates generally to electronic circuits, in particular, to apparatus and methods for monitoring and/or prevention of failures (or potential failures) relating to electromigration.

Background

Thermal management and management of average current densities in conductors are increasingly of concern in the operation of integrated circuits (ICs). For example, these issues may affect interconnects used in ICs in the mobile, server and automotive industries. Both of these issues may significantly affect the lifetime of interconnects in the back end of line (BEOL).

Interconnects may be especially vulnerable to electromigration (EM) failures. EM is a phenomenon relating to the self-diffusion of metallic ions (e.g., ions in a conductor) that results from electric field and movement of conducting electrons. EM may be strongly impacted by temperature and average direct current density, especially as current densities increase and the structural size of electronics (e.g., the width of conductors in ICs) decrease.

Electromigration damage may be cumulative in that the migration of ions may contribute over time to cause an open circuit (due to voids forming from ion migration) or a short circuit (due to hillocks formed by ion accumulation). A failure of even a single conductor may cause an IC to malfunction. If the malfunction occurs before an end of a stipulated lifetime of the IC, expensive recalls or loss of market share may result.

SUMMARY

Aspects of an apparatus are disclosed. The apparatus includes a circuit and a conductor interconnecting a portion of the circuit. The apparatus further includes a processor. The processor is configured to determine a temperature of the conductor and adjust at least one parameter related to the conductor in response to the determined temperature rising above a threshold. The at least one parameter includes a lifetime estimate for the conductor.

Aspects of a method of operating an apparatus including a circuit and a conductor interconnecting a portion of the circuit are disclosed. The method includes determining a temperature of the conductor, and adjusting at least one parameter related to the conductor in response to the determined temperature rising above a threshold. The at least one parameter includes a lifetime estimate for the conductor.

Further aspects of an apparatus are disclosed. The apparatus includes a circuit and a conductor interconnecting a portion of the circuit. The apparatus further includes means for determining a temperature of the conductor and means for adjusting at least one parameter related to the conductor in response to the determined threshold rising above a threshold. The at least one parameter includes a lifetime estimate for the conductor.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and details of these aspects are capable of modification in various other respects. Accordingly, the drawings and detailed description are to be regarded as illustrative in nature and not as restrictive.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The term "apparatus" shall be construed to include any integrated circuit or system, or any portion of an integrated circuit or system (e.g., modules, components, circuits, or the like residing in an integrated circuit or part of an integrated circuit). The term "apparatus" shall also be construed to include any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together.

Any reference to an element herein using a designation such as "first," "second," and so forth does not generally limit the quantity or order of the elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of apparatus and methods will now be presented in the context of an integrated circuit. However, as those skilled in the art will readily appreciate, the various aspects of apparatus and methods presented in this disclosure are not limited to integrated circuits, but may be applied to other types of circuits now known or later developed that require some form of thermal management. Accordingly, any reference to a specific application for an apparatus or method is intended only to illustrate exemplary aspects of the present invention with the understanding that such aspects may have a wide range of applications.

Figure 1:
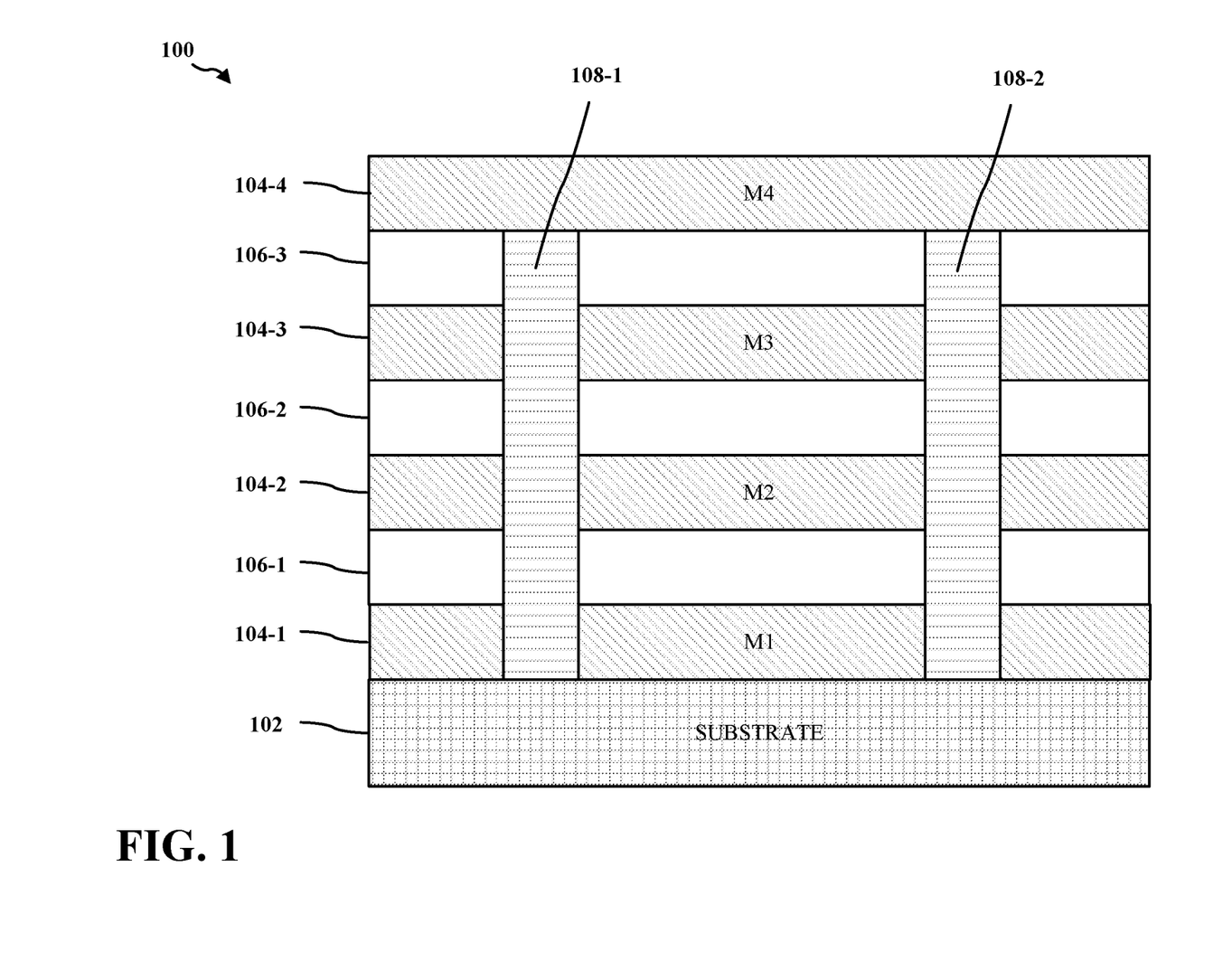
FIG. 1 illustrates a cross-sectional view of an exemplary embodiment of an integrated circuit (IC).

FIG. 1 illustrates a cross-sectional view of an exemplary embodiment of an IC 100. The IC 100 includes a substrate 102, which may be made of silicon. The substrate 102 has a lowest metal layer 104-1 disposed thereon, the lowest metal layer 104-1 being designated the metal-1 or M1 layer. A first dielectric insulating layer 106-1 is disposed on the lowest metal layer 104-1. A second metal layer 104-2 is disposed on the first dielectric insulating layer 106-1, the second metal layer 104-2 being designated the metal-2 or M2 layer. A second dielectric insulating layer 106-2 is disposed on the second metal layer 104-2. A third metal layer 104-3 is disposed on the second dielectric insulating layer 106-2, the third metal layer 104-3 being designated the metal-3 or M3 layer. A third dielectric insulating layer 106-3 is disposed on the third metal layer 104-3. A fourth metal layer 104-4 is disposed on the third dielectric insulating layer 106-3, the fourth metal layer 104-4 being designated the metal-4 or M4 layer. A fourth dielectric insulating layer 118 is disposed on the fourth metal layer 116. In other illustrative embodiments, more alternating dielectric insulating and metal layers may be added.

As illustrated in FIG. 1, a connection between the M4 layer 104-4 and the substrate 102 may be made through conductive vias 108-1 and 108-2. The conductive vias 108-1 and 108-2 may be suitably insulated from the intervening metal layers 104-3, 104-2, and 104-1. In an exemplary embodiment, the conductive via 108-1 may be used to connect a circuit disposed in the substrate 102 with a conductor interconnecting a portion of the circuit (e.g., using the conductive via 108-2). The conductor may be disposed in the M4 layer 104-4. Therefore, although the conductor in the M4 layer 104-4 is spatially separated from the substrate 102, the conductor is electrically coupled to the substrate 102 by vias 108-1 and 108-2.

To avoid EM failures, IC manufacturers provide design rules that limit the maximum current density of both average and RMS (root mean square) currents. The RMS current is used to ensure that the self-heating of a conductor remains below an allowed limit. For example, the allowed limit may be a temperature that is 5 degrees Celsius above a maximum junction temperature (e.g., 105 degrees Celsius). When the design rules are overly conservative, designers may be required to, perhaps unnecessarily, sacrifice product performance (e.g., as a result of limiting drive currents). Further, the design rules may require cooling systems, perhaps unnecessarily, to ensure that temperatures stay below the allowed limit.

Even if a design successfully meets the corresponding design rules, failures in one or more conductors may still occur. For example, the temperature of a conductor may be increased due to surrounding conditions (e.g., neighboring conductors, hot vias that are connected to the conductor). Therefore, even if a conductor is designed to meet the design rules, the temperature of the conductor may nonetheless exceed the allowed limit during operation.

As the temperature of the conductor increases, the amount of average current that is applied to the conductor may be reduced. A reduction in the applied current may prevent further increases in temperature. Accordingly, the likelihood that a failure is triggered (e.g., a failure due to EM) is reduced. As such, during operation of an IC (e.g., IC 100), determining a temperature of a conductor may be used to monitor the likelihood of a failure and/or to take action(s) to prevent failure within a specified lifetime of the device.

As described earlier with reference to FIG. 1, a conductor may be located in a layer that is spatially separated from the substrate 102. For example, the conductor may be located in the M4 layer 104-4. On-die monitoring of the conductor may be based on a pre-silicon analysis. In this regard, the monitoring may be performed using current limits that are determined based on an assumption that all back end of line (BEOL) are at a constant temperature. For example, the constant temperature may be a temperature that is 5 or 10 degrees Celsius above the temperature of the silicon (see, e.g., substrate 102). However, such an assumption may not always be reliable because temperatures at BEOL (e.g., at layers that are located further away from the surface of the silicon) may rise above the assumed temperature.

Various aspects directed to monitoring and/or preventing failure relating to EM will be presented. Particular aspects may involve adjusting an operating point of an integrated circuit, e.g., in order to increase the likelihood that a specified life expectancy will be met. Alternatively (or in addition), particular aspects may involve communicating information regarding potential failures to manufacturers, suppliers and/or users of the integrated circuit or the intermediate or end product containing the integrated circuit. The recipients of such information may then use the information to make upgrade/purchasing decisions.

Particular aspects are disclosed with reference to failures related to EM. However, such aspects may also apply to other types of failures that may occur in silicon devices and in systems level components.

In various exemplary embodiments of apparatus and methods, the temperature of each of one or more conductors of an IC is monitored during operation of the IC. The one or more conductors may be identified during the design of the IC. For example, a simulation for determining temperature gradients may be performed to identify conductors that are most susceptible to operating at a temperature(s) above a threshold. The threshold may correspond to a foundry limit. The temperature(s) of the identified conductor(s) may be monitored during operation of the IC.

For each conductor that is identified, other elements associated with the conductor may also be identified. For example, a driver circuit corresponding to the conductor may be identified. The driver circuit may be a circuit that drives the conductor, e.g., by supplying current that is to be carried by the conductor. In addition, fan-outs of the conductor may be identified. The information identified for each conductor may be stored (e.g., in ROM).

In order to facilitate temperature monitoring of a particular conductor, the design of the IC may include one or more features. The features will be described with reference to FIG. 2.

Figure 2:
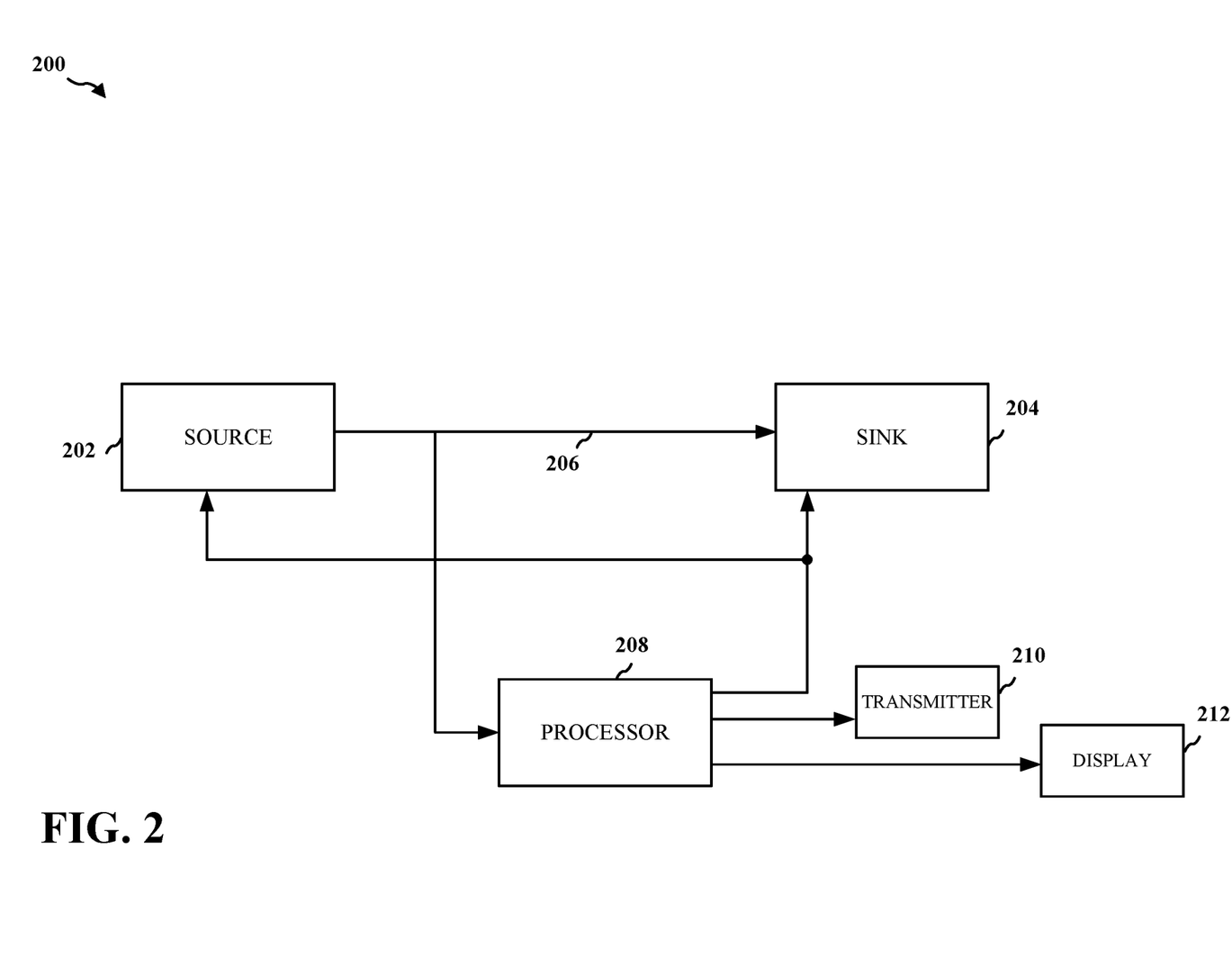
FIG. 2 illustrates a functional block diagram of an exemplary embodiment of a processor monitoring an IC.

FIG. 2 illustrates a functional block diagram of an exemplary embodiment of a processor monitoring an IC. In this embodiment, the processor 208 is shown as part of the IC 200. However, the processor may be separate from the IC. Specifically, the processor may be discrete circuitry, part of another IC, a stand-alone IC dedicated to monitoring and/or preventing failure relating to EM of the IC 200, or distributed across multiple ICs and/or discrete circuits.

The IC 200 includes a circuit. For ease of explanation, the circuit is represented in FIG. 2 by a source 202 and a sink 204. A conductor 206 interconnects the source 202 and the sink 204. The source 202 may be any suitable circuit configured to output a signal on the conductor 206, and the sink 204 may be any suitable circuit capable of receiving the signal output by the source 202 onto the conductor 206. The source 202 may output the signal in the form of a current. The conductor 206 may include one or more metal traces. As those skilled in the art will readily appreciate, the circuit may include any number of sources and sinks interconnected in any suitable fashion to provide the requisite functionality.

The sink 204 and the source 202 will generally be located on the substrate (e.g., substrate 102), but may reside in any layer. The conductor 206 may reside in any layer above the substrate (e.g., layer 104-4). When the conductor 206 resides at a layer located further away from the substrate, a temperature of the conductor 206 may rise above an assumed temperature (e.g., an estimated temperature that is relative to a temperature of the substrate) during operation.

As explained above, the IC 200 may include the processor 208. The processor 208 may be located in the substrate 102 of FIG. 1 or any other layer. The processor 208 is coupled to the conductor 206. The processor 208 may be coupled to the conductor 206 by vias (e.g., vias 108-1, 108-2) or by any other suitable means.

The processor 208 may be configured to determine a temperature of the conductor 206. The processor 208 may be configured also to adjust at least one parameter related to the conductor in response to the determined temperature rising above a threshold. The parameter(s) adjusted by the processor 208 may include an operating frequency or an operating voltage of a portion of the circuit (e.g., the source 202 or the sink 204) interconnected by the conductor 206. Alternatively (or in addition), the parameter(s) may include a lifetime estimate for the conductor 206. As will be described in more detail later, the processor 208 may provide information regarding the adjusted lifetime estimate to a transmitter 210 and/or a display 212.

Figure 3:
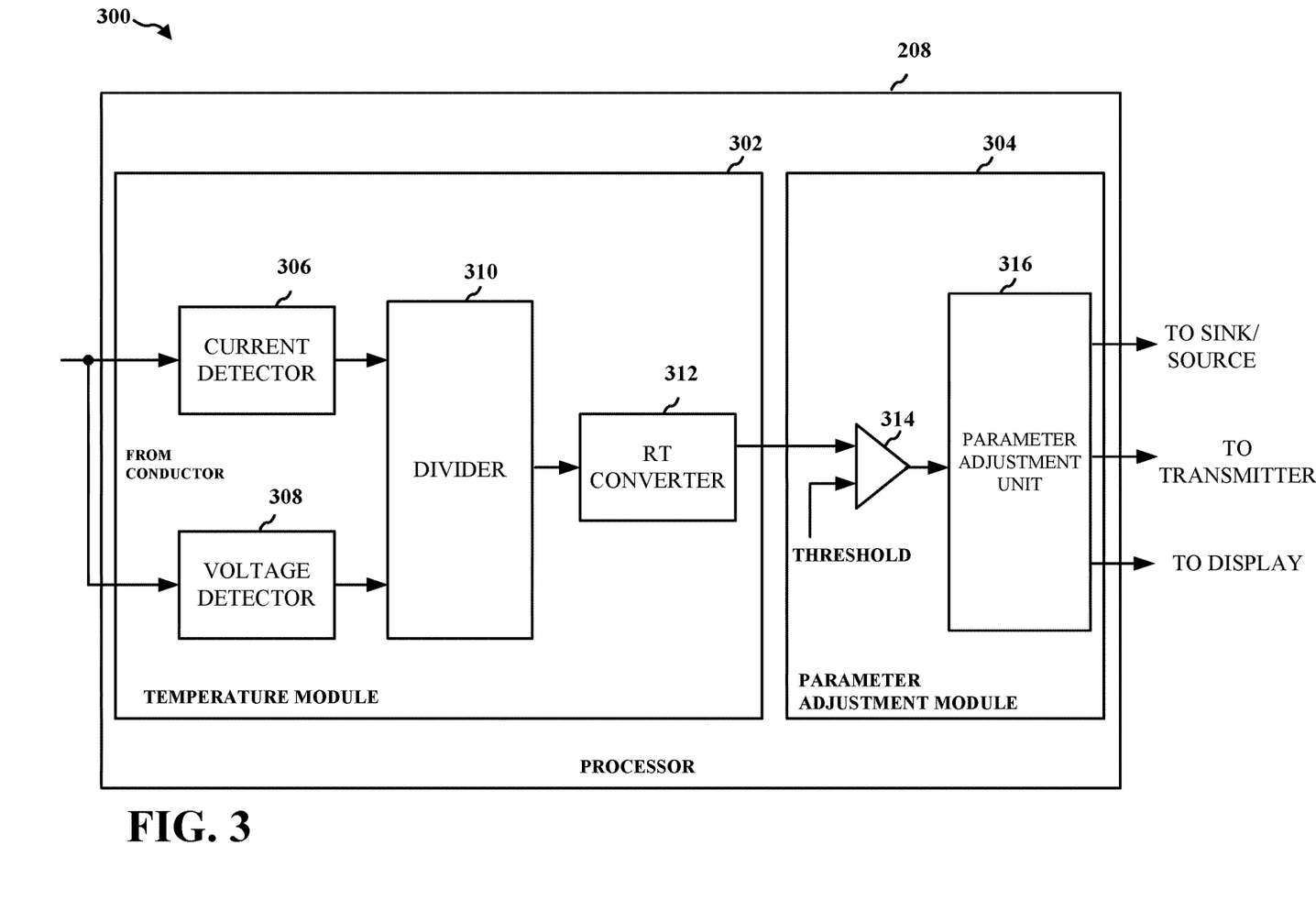
FIG. 3 illustrates a functional block diagram of an exemplary embodiment of a processor.

FIG. 3 illustrates a functional block diagram 300 of an exemplary embodiment of the processor 208. The processor 208 includes a temperature module 302 and a parameter adjustment module 304. The temperature module 302 provides a means for determining the temperature of the conductor (e.g., conductor 206). The parameter adjustment module 304 provides a means for adjusting at least one parameter related to the conductor in response to the determined temperature rising above a threshold.

The temperature module 302 may determine the temperature of the conductor by determining a resistance of the conductor. The temperature module 302 may determine the resistance by measuring a voltage across the conductor. The temperature module 302 may measure the voltage using a voltage-controlled oscillator (VCO). In addition to measuring the voltage, the temperature module 302 may measure a current through the conductor, and determine the resistance from the measured voltage and the measured current. Various means to measure current are known in the art. For example, the current to be measured may be compared with a known reference current. In some examples, the resistance may be determined by dividing the measured voltage by the measured current. Then, the temperature module 302 may determine the temperature of the conductor based on the determined resistance.

The temperature module 302 includes a current detector 306, a voltage detector 308, a divider 310, and a resistance-to-temperature (RT) converter 312. The current detector 306, voltage detector 308, and divider 310 operate together to provide a means for determining the resistance of the conductor. Specifically, the current detector 306 provides a means for measuring the current through the conductor, the voltage detector 308 provides a means for measuring the voltage across the conductor, and the divider 310 provides a means for determining the resistance of the conductor from the measured voltage and measured current. The RT converter 312 provides a means for determining the temperature based on the determined resistance.

The current detector 306 measures a current that is carried by the conductor. The voltage detector 308 measures a voltage differential that exists across the conductor—e.g., between two portions of the conductor. One of the portions may be a portion at which the conductor is connected to the source (e.g., a portion at which the conductor 206 is coupled to the source 202 by the via 108-1). The other portion may be a portion at which the conductor is connected to the sink (e.g., at which the conductor 206 is coupled to the sink 204 by the via 108-2).

The current measured by the current detector 306 and the voltage measured by the voltage detector 308 are used to determine the temperature of the conductor. In one exemplary embodiment, the temperature may be determined from the resistance of the conductor. The resistance may be based on the provided current and voltage measurements. For example, the divider 310 may divide the voltage measurement by the current measurement to determine the resistance. The resistance provides an indication of the temperature. Based on the determined resistance, the RT converter 312 may determine the temperature of the conductor. For example, the RT converter 312 may apply the determined resistance in an equation that maps resistance values to specific temperatures. As another example, the RT converter 312 may use (or may be) a look-up table that maps resistance values to specific temperatures. The equation and/or the values of the look-up table may have been determined based on temperature coefficients of resistance that are supplied (e.g., in a foundry design rule manual) and/or temperature coefficients based on layers of the IC.

The parameter adjustment module 304 may adjust at least one parameter related to the conductor in response to the determined temperature rising above a threshold. The parameter adjustment module 304 may compare the determined temperature against the threshold to determine if the determined temperature is rising above the threshold. If it is determined that the temperature is rising above the threshold, the parameter adjustment module 304 may adjust at least one parameter that is related to the conductor.

The parameter(s) adjusted by the parameter adjustment module 304 may include an operating frequency or an operating voltage of a portion of the circuit (e.g., source 202 or sink 204) interconnected by the conductor. A reduction in the operating frequency causes the portion of the circuit to operate at a lower frequency. Therefore, the conductor, which interconnects the portion of the circuit, is driven at a lower level of current. Similarly, a reduction in the operating voltage of the portion of the circuit causes the conductor to be driven at a lower level of current. When the current carried by the conductor is reduced, the temperature of the conductor may be decreased (or at least prevented from further increasing).

Alternatively (or in addition), the parameter(s) adjusted by the parameter adjustment module 304 may include a lifetime estimate for the conductor. The adjusted lifetime estimate may be stored, displayed and/or transmitted.

The parameter adjustment module 304 may include a comparator 314 and a parameter adjustment unit 316. The comparator 314 may compare the temperature of the conductor against a threshold. The threshold may correspond to an allowable temperature limit (e.g., a limit at which the likelihood of a resulting EM failure is low). By comparing the temperature of the conductor against the threshold, the comparator 304 determines if the temperature is rising above the threshold. If it is determined that the temperature is rising above the threshold, the parameter adjustment unit 316 may adjust one or more parameters.

Figure 4:
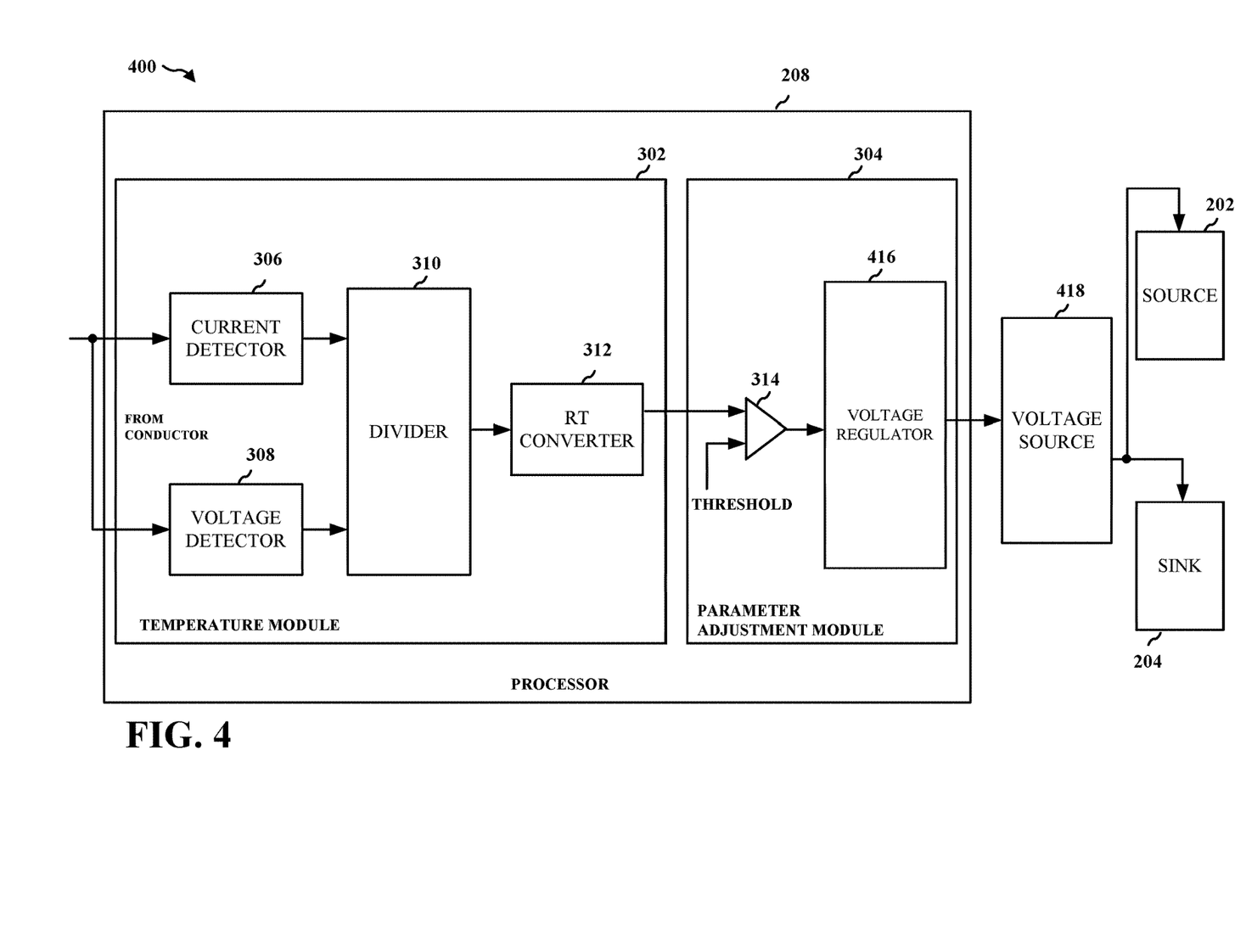
FIG. 4 illustrates a functional block diagram of an exemplary embodiment of a processor regulating the operating voltage of the IC.

FIG. 4 illustrates a functional block diagram 400 of an exemplary embodiment of a processor regulating the operating voltage of the IC. With reference to FIG. 4, the one or more parameters adjusted by the parameter adjustment module 304 may include an operating voltage of the circuit or any portion of the circuit. For example, the processor 208 may reduce the operating voltage supplied to the source 202 and/or the sink 204 described earlier in connection with FIG. 2. A reduction in the operating voltage causes the conductor, which interconnects the source 202 and/or the sink 204, to be driven at a lower level of current. When the current carried by the conductor is reduced, the temperature of the conductor may be decreased (or at least prevented from further increasing).

The parameter adjustment unit 316 may be (or may include) a voltage regulator 416 that regulates one or more voltage sources used to power the circuitry on the IC. For example, the operating voltage of a source 202 (see FIG. 2) may be provided by a voltage source 418. For regulating a voltage provided by the voltage source 418, the temperature module 302 of the processor 208 may be coupled to the voltage regulator 416. The voltage regulator 416 regulates the operating voltage that is provided by voltage source 418 to the source 202.

If it is determined that the temperature of the conductor (e.g., conductor 206) is above the threshold, the comparator 314 may control the voltage regulator 416 such that the regulated voltage is reduced. The reduction in the voltage supplied to the source 202 effectively reduces the current that is carried by the conductor and, accordingly, causes a decrease in the temperature of the conductor.

In one exemplary embodiment, the comparator 314 provides a two-state output for controlling the voltage regulator 416. If the temperature of the conductor is determined to be below the threshold, the state of the output causes the voltage regulator 416 to regulate the voltage such that the voltage source 418 provides a normal operating voltage at a first amplitude. However, if the temperature of the conductor is determined to be above the threshold, the state of the output transitions causing the voltage regulator 416 to regulate the voltage such that the voltage source 418 provides a reduced voltage at a second amplitude that is smaller than the first amplitude. As such, the voltage regulator 416 regulates between two different voltages.

In another exemplary embodiment, the voltage regulator regulates between more than two different voltages. In such an implementation, a temperature that is above the threshold to a larger degree may effectively trigger a larger reduction in the supplied voltage. For example, if the temperature is above the threshold by a sufficiently large degree, the comparator 314 may even control the voltage regulator 416 to shut down the source 202. The current that is carried by the conductor may then be effectively reduced to zero. Accordingly, the comparator 314 may provide a three-or-more-state output (e.g., three-state output, four-state output, etc.) for controlling the voltage regulator 416 to regulate between three or more different voltages. The output of the comparator 314 may be a function of a difference between the temperature and the threshold. Therefore, a greater difference between the temperature and the threshold leads to a greater reduction in voltage.

Figure 5:
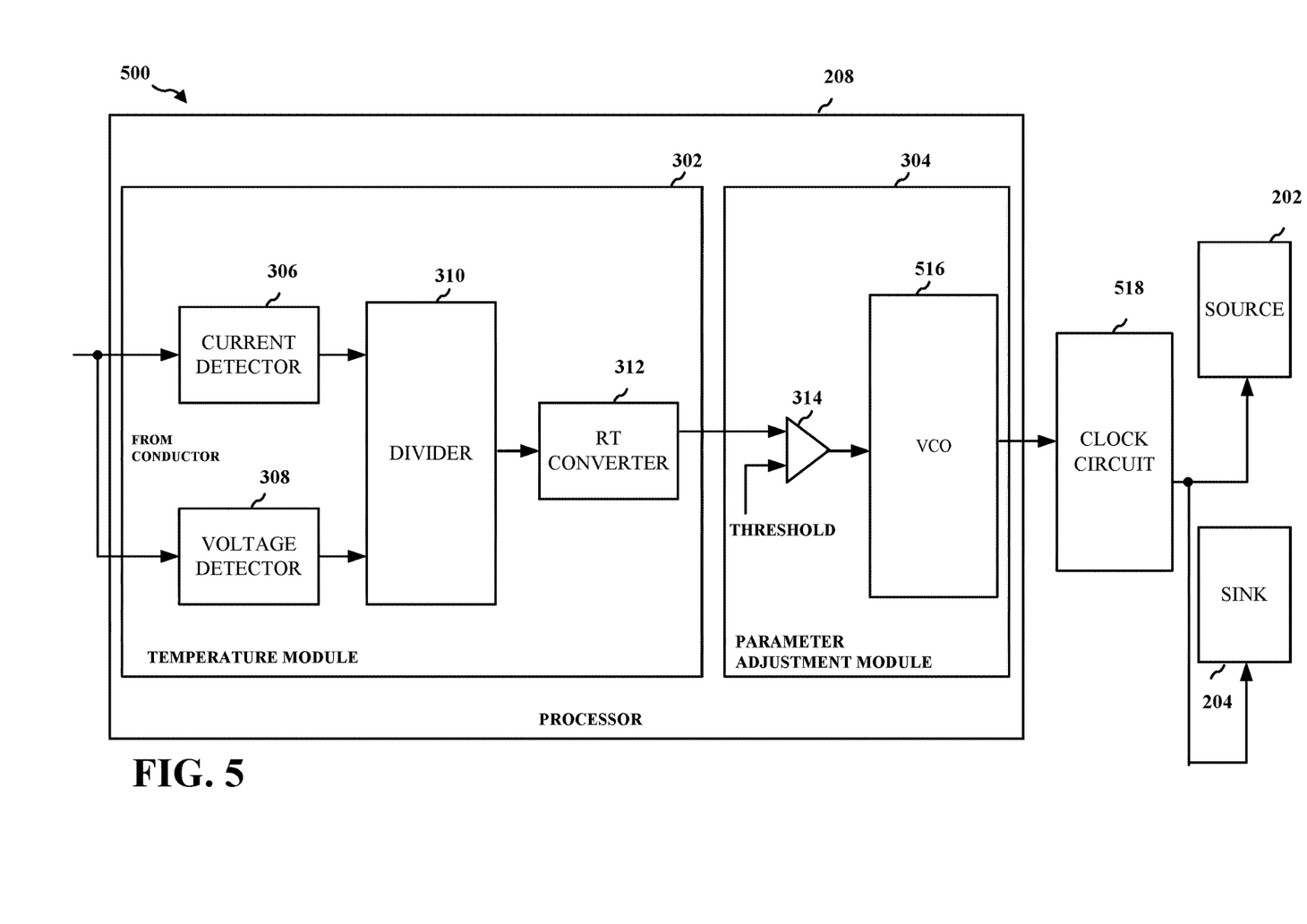
FIG. 5 illustrates a functional block diagram of an exemplary embodiment of a processor regulating the operating frequency of the IC.

FIG. 5 illustrates a functional block diagram 500 of an exemplary embodiment of a processor regulating the operating frequency of the IC. With reference to FIG. 5, the one or more parameters may include an operating frequency of the circuit or any portion of the circuit. For example, the processor may reduce the frequency of a clock supplied to the source 202 and/or the sink 204 described earlier in connection with FIG. 2. A reduction in the clock frequency causes the portion of the circuit to operate at a lower frequency. Therefore, the conductor, which interconnects the portion of the circuit, is driven at a lower level of current. When the current carried by the conductor is reduced, the temperature of the conductor may be decreased (or at least prevented from further increasing).

The parameter adjustment unit 316 may be a variable frequency oscillator whose frequency may be tuned over some range. The variable frequency oscillator may be used as the clock for the circuit or any portion of the circuit. Alternatively, the variable frequency oscillator may be used as a reference signal in a phase-lock loop to control the frequency of the clock. An example of a suitable variable frequency oscillator is a voltage controlled oscillator (VCO) 516. In combination with a clock circuit 518, the VCO 516 supplies the clock to the source 202 and/or sink 204. The frequency of the clock is adjusted by the VCO 516.

If it is determined that the temperature of the conductor (e.g., conductor 206) is above the threshold, the comparator 314 may control the VCO 516 such that the frequency of the clock is reduced. The reduction in the frequency of the clock supplied to the source 202 and/or sink 204 reduces the current carried by the conductor and, accordingly, causes a decrease in the temperature of the conductor.

Similar to the exemplary embodiment described earlier in connection with FIG. 4, the comparator 314 provides a two-state output for controlling the VCO 516. If the temperature of the conductor is determined to be below the threshold, the output state of the VCO 516 adjusts the frequency of the clock such that the clock circuit 518 provides a normal clock of a first frequency. However, if the temperature of the conductor is determined to be above the threshold, the output state transitions causing the VCO 516 to reduce the frequency of the clock such that the clock circuit 518 provides a clock of a second frequency that is lower than the first frequency. As such, the clock circuit 518 supplies a clock that is of one of two different frequencies.

Alternatively, the clock circuit 518 may supply a clock that is tunable between more than two different frequencies (e.g., the clock may have variable frequencies). In some examples, the clock frequency may vary with the difference between the temperature and the threshold. In such an embodiment, a temperature that is above the threshold to a larger degree may effectively trigger a larger reduction in the frequency of the supplied clock. For example, if the temperature is above the threshold by a sufficiently large degree, the comparator 314 may even control the VCO 516 to effectively shut down operation of the source 202 and/or sink 204. The current that is carried by the conductor may then be effectively reduced to zero. Accordingly, the comparator 314 provides a more-than-three-state output (e.g., three-state output, four-state output, etc.) for controlling the VCO 516 such that a clock that is one of three or more different frequencies is supplied. The output of the comparator 314 may be a function of a difference between the temperature and the threshold. Therefore, a greater difference between the temperature and the threshold leads to a greater reduction in frequency of the supplied clock.

Figure 6:
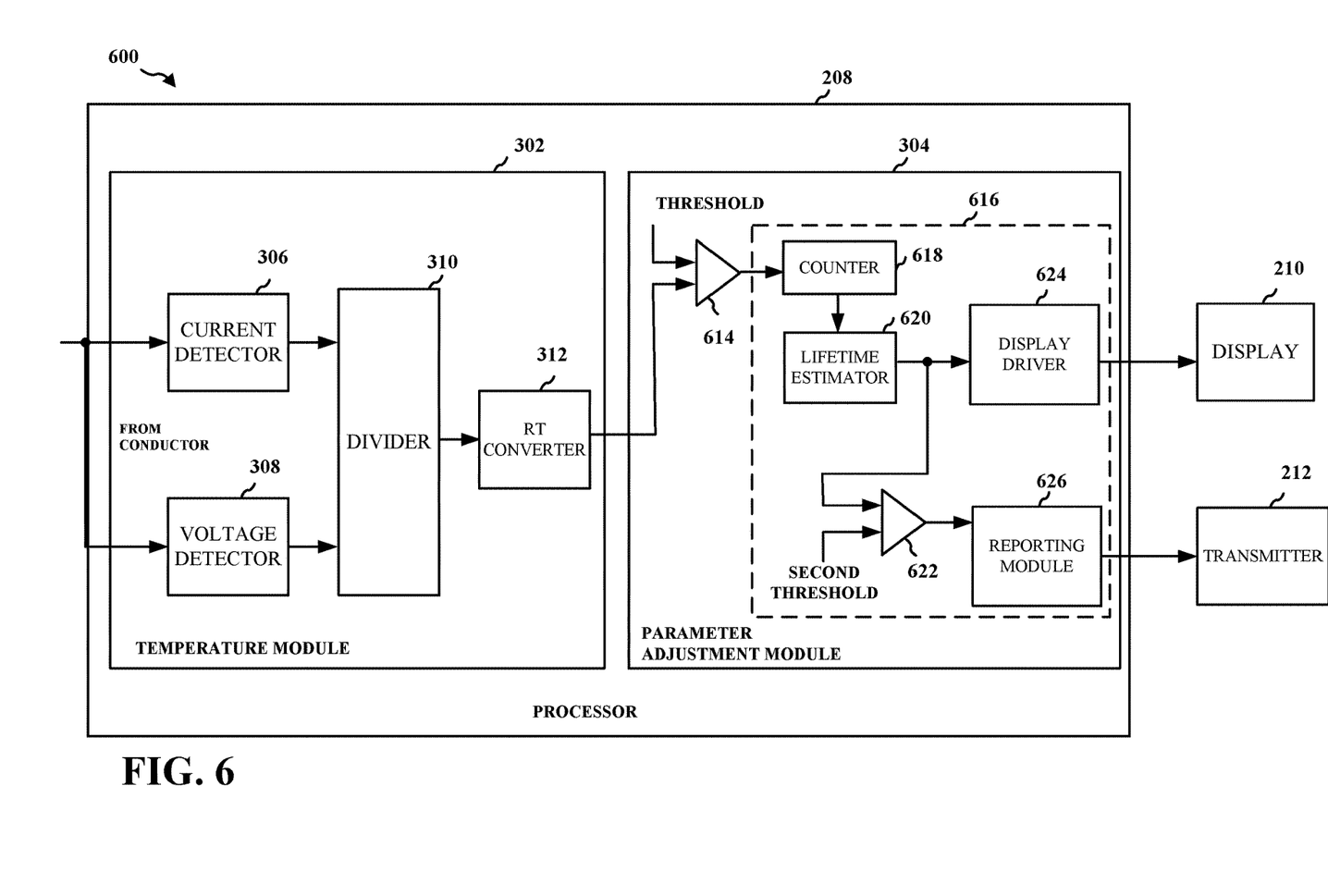
FIG. 6 illustrates a functional block diagram of an exemplary embodiment of a processor with a lifetime estimator.

FIG. 6 illustrates a functional block diagram 600 of an exemplary embodiment of a processor with a lifetime estimator. With reference to FIG. 6, the one or more parameters that are adjusted by the parameter adjustment module 304 may include a lifetime estimate for the conductor (e.g., conductor 206). The parameter adjustment module 304 includes comparator 614 and a parameter adjustment unit 616. The parameter adjustment unit 616 includes a counter 618, a lifetime estimator 620, a comparator 622, a display driver 624 and a reporting module 626. The comparator 614 and the counter 618 operate together to provide a means for determining a duration of time that the temperature of the conductor is above a threshold. The lifetime estimator 620 provides a means for adjusting a lifetime estimate (e.g., of the conductor) based on the determined duration of time. The display driver 624 provides a means for providing information related to the adjusted lifetime estimate to a display. The comparator 622 provides a means for determining whether the adjusted lifetime estimate is below a second threshold. The reporting module 626 provides a means for reporting information related to the adjusted lifetime estimate in response to the adjusted lifetime estimate being below the second threshold.

The comparator 614 compares the output from the temperature module 302 against a threshold. When the output from the temperature module 302 exceeds the threshold, the comparator output transitions to an active state indicating that the temperature of the conductor may be exceeding the specified temperature rating. The active state enables the counter 618, which determines the duration of time that the temperature is above the threshold. The output of the counter 618 is provided to the lifetime estimator 620.

When the counter output reaches a certain threshold (or count), the lifetime estimator 620 adjusts the lifetime estimator of the conductor. The lifetime estimator 620 may use a mathematical model for calculating an adjusted mean life to failure based on, for example, the threshold used by the comparator 614 (the threshold against which the temperature is compared). The adjusted lifetime estimate may be shorter than an originally specified lifetime estimate.

If the temperature of the conductor drops below the threshold used by the comparator 614 before the count reaches the corresponding count threshold, the output from the temperature module 302 will fall below the comparator threshold. Accordingly, the comparator output transitions back to an inactive state, causing the counter 618 to reset.

Information regarding the adjusted lifetime estimate is output to the display driver 624. The display driver 624 controls the display 212 such that the information may be displayed for viewing by a user. As such, the user may be notified of the adjusted lifetime estimate. The user may then react to the information accordingly. For example, the user may seek to purchase a replacement unit earlier than he had expected.

Alternatively (or in addition), information regarding the adjusted lifetime estimate is output to the comparator 622. The comparator 622 compares the adjusted lifetime estimate against a second threshold. If it is determined that the adjusted lifetime estimate is below the second threshold, the comparator 622 provides corresponding information to the reporting module 626. As those skilled in the art will readily appreciate, the reporting module 626 may take any of various forms. According to an exemplary embodiment, in response to receiving the information from the comparator 622, the reporting module 626 formats the information for transmission over a wired or wireless medium. The formatted information is output to the transmitter 210.

The transmitter 212 may transmit the information to one or more entities associated with the manufacture and/or sale of the device (e.g., a manufacturer, supplier, distributor and/or seller). Based on the information received, the one or more entities may conclude that an upgrade of the device is required at an earlier time than expected. The one or more entities may then respond to the information accordingly.

Figure 7:
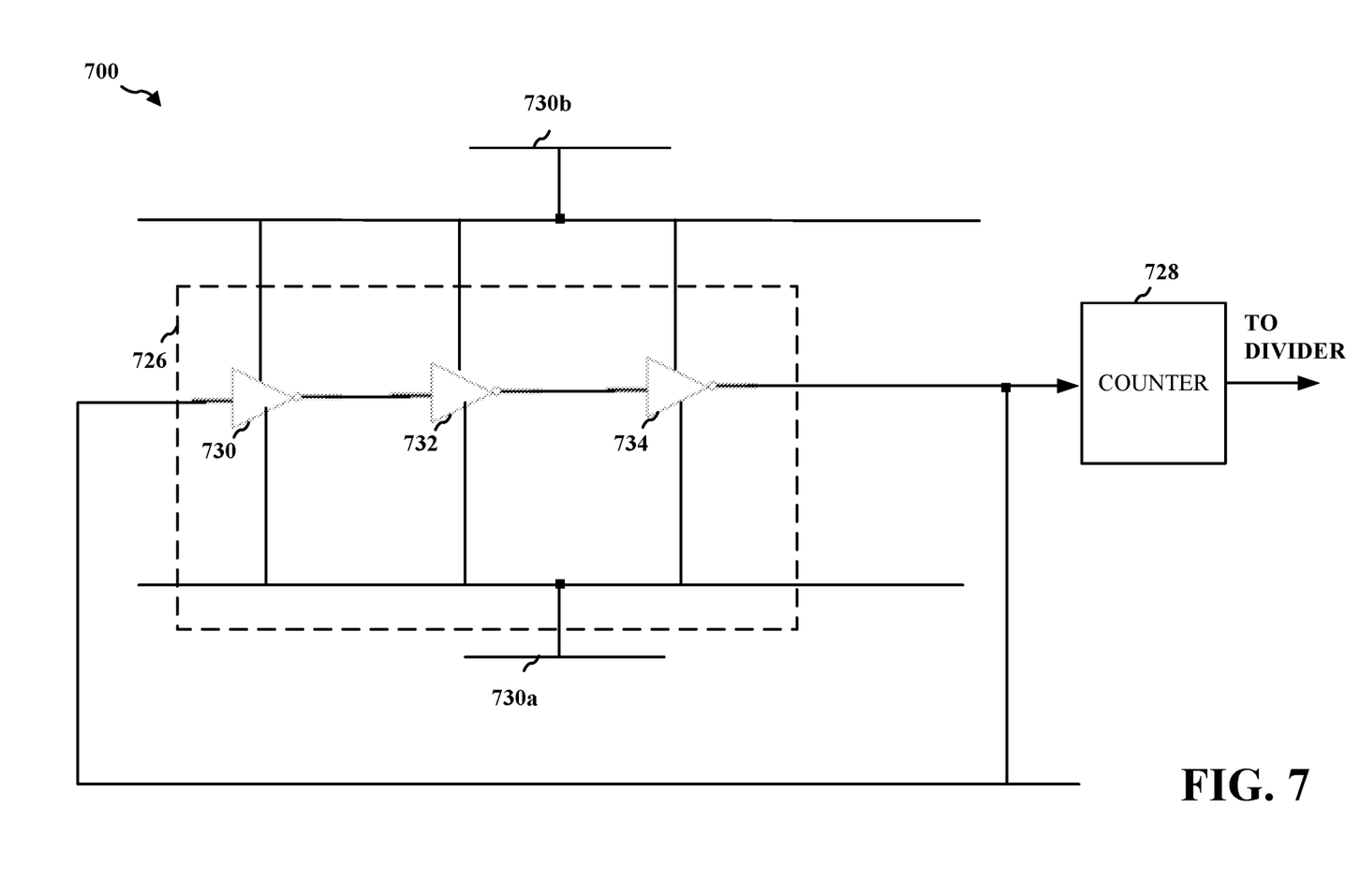
FIG. 7 illustrates a schematic diagram of an exemplary embodiment of a voltage detector.

As described earlier with reference to FIG. 3, the processor 208 may include a voltage detector 308. FIG. 7 illustrates a schematic diagram 700 of an exemplary embodiment of a voltage detector.

With reference to FIGS. 3 and 7, the voltage detector 208 may include a voltage controlled oscillator 726 and a counter 728. In this example, the VCO is a ring oscillator. The ring oscillator 726 has an odd number of inverters that are connected in series with the output being fed back to the input. For example, the number of inverters may be three. With reference to FIG. 7, the ring oscillator 726 includes inverters 730, 732, 734.

The ring oscillator 726 oscillates at a frequency that is based on a voltage differential (e.g., a voltage differential between nodes 730b, 730a). As will be described in more detail with reference to FIG. 8, the voltage differential may correspond to a voltage differential that exists across the conductor (e.g., conductor 206). A voltage differential of a larger magnitude causes the ring oscillator 726 to oscillate at a higher frequency. Conversely, a difference of a smaller magnitude causes the ring oscillator 726 to oscillate at a lower frequency. The counter 728 counts the number of oscillations of the ring oscillator 726. By counting the number of oscillations over a certain period of time, the output of the counter 728 represents the oscillation frequency of the ring oscillator 726, and, accordingly, represents the underlying voltage differential. Therefore, the voltage differential that exists across the conductor is determined. The counter output is provided to a divider (e.g., divider 310).

Figure 8:
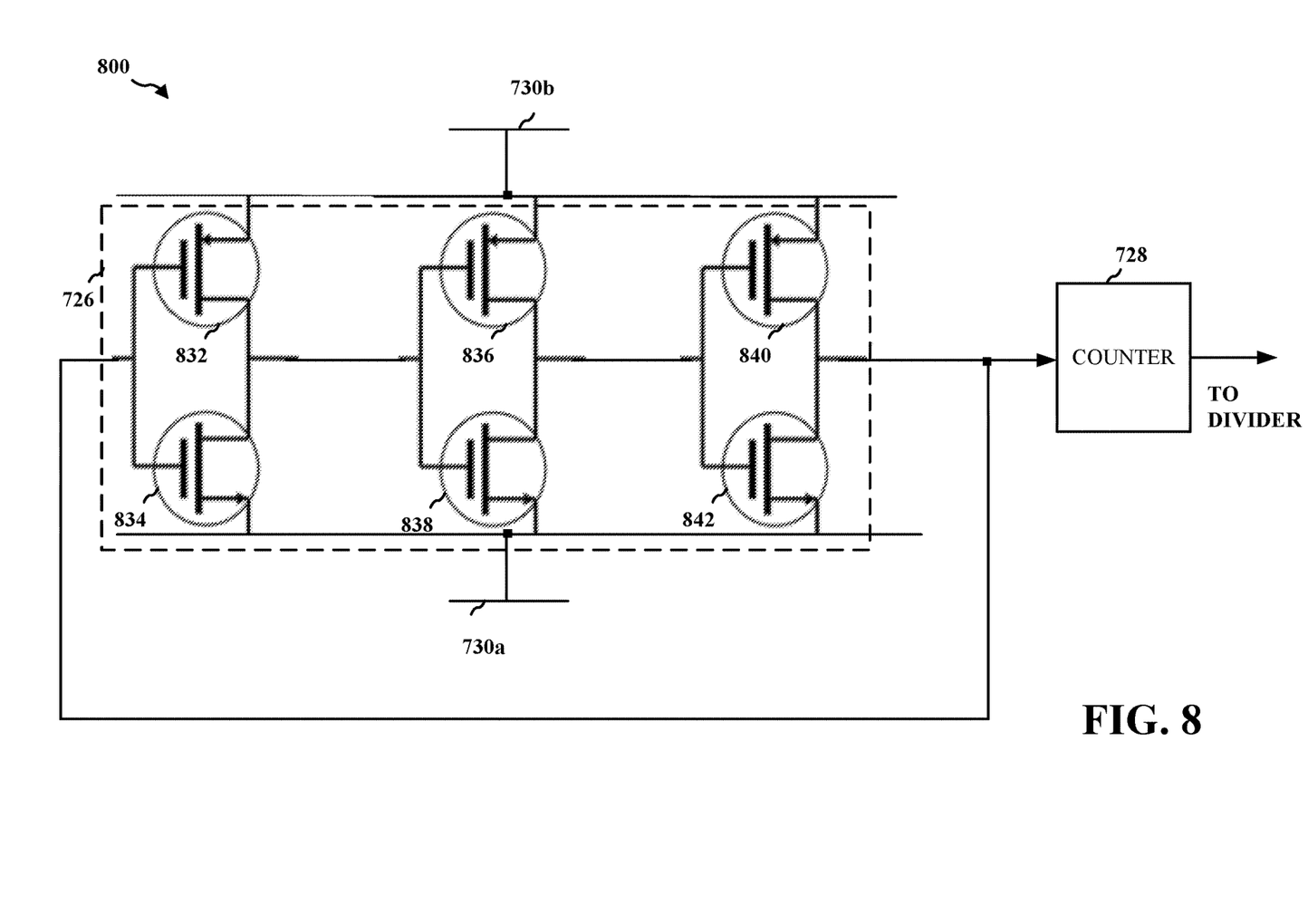
FIG. 8 illustrates a detailed schematic diagram of the exemplary embodiment of the voltage detector of FIG. 7.

FIG. 8 illustrates a detailed schematic diagram of the exemplary embodiment of the voltage detector of FIG. 7.

Each of the inverters includes a p-channel transistor and an n-channel transistor. With reference to FIG. 8 and with reference back to FIG. 7, inverter 730 includes p-channel transistor 832 and n-channel transistor 834. Inverter 732 includes p-channel transistor 836 and n-channel transistor 838, and inverter 734 includes p-channel transistor 840 and n-channel transistor 842. The respective sources of the p-channel transistors 832, 836, 840 are connected to node 730b. Node 730b corresponds to a portion of the conductor (e.g., conductor 206) that is connected to the source 202 (e.g., a portion of conductor 206 coupled to the source 202 at via 108-1). The respective sources of the n-channel transistors 834, 838, 842 are coupled to node 730a. Node 730a corresponds to a portion of the conductor that is connected to the sink 204 (e.g., a portion of conductor 206 coupled to the sink 204 at via 108-2).

As described earlier in connection with FIG. 7, a voltage differential between nodes 730b and 730a causes the ring oscillator 726 to oscillate at a particular frequency. A voltage differential of a larger magnitude causes the ring oscillator 726 to oscillate at a higher frequency. Conversely, a difference of a smaller magnitude causes the ring oscillator 726 to oscillate at a lower frequency.

With reference back to FIG. 3, a current detector 306 is included in the processor 208 for measuring a current carried by the conductor (e.g., conductor 206). The current detector 306 may utilize a current mirror that effectively copies the current output by the source 202 to the conductor.

Figure 9:
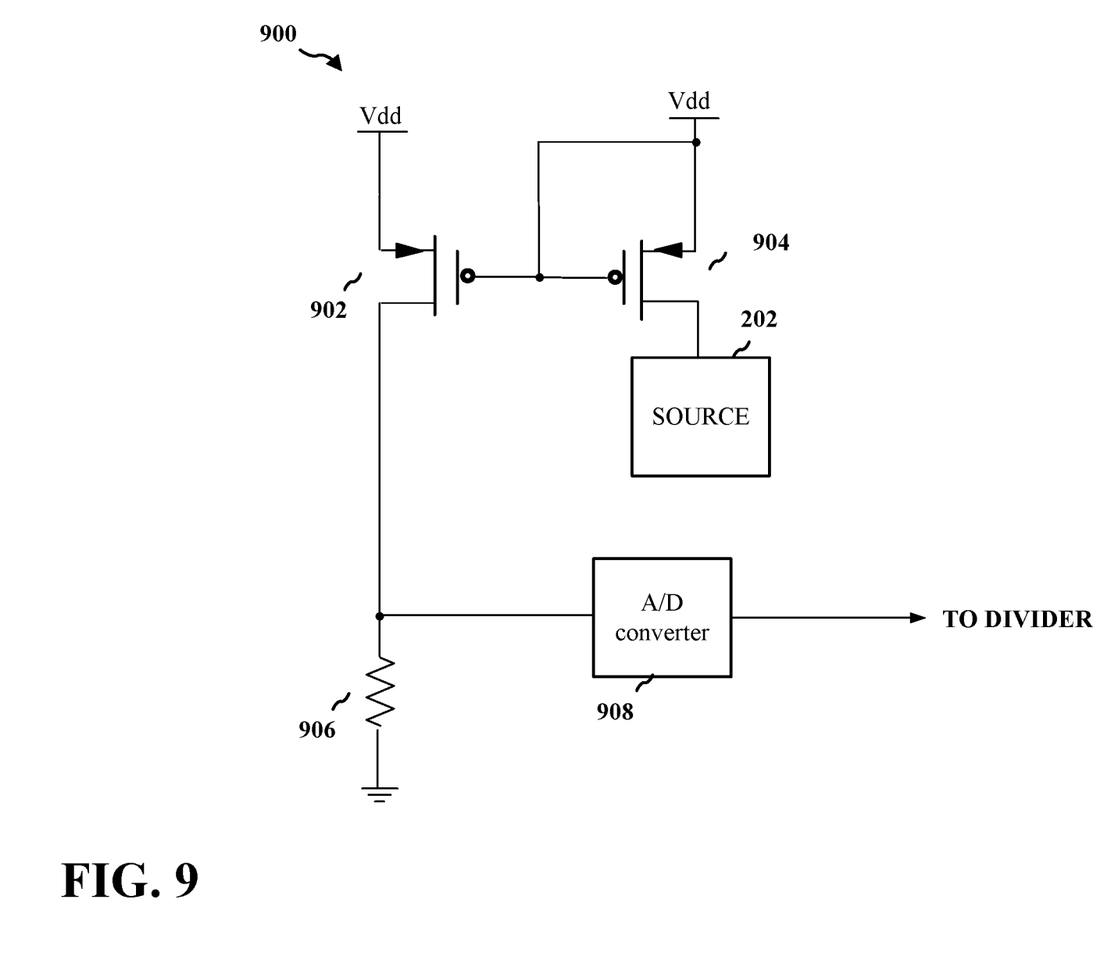
FIG. 9 illustrates a schematic diagram of an exemplary embodiment of a current detector.

FIG. 9 illustrates a schematic diagram 900 of an exemplary embodiment of a current detector (e.g., current detector 306). The current conducted by p-channel transistor 902 and resistor 906 mimics the current conducted by p-channel transistor 904 and the source 202. In more detail, the drain of the p-channel transistor 904 is coupled to the source 202. The source and the gate of the p-channel transistor 904 are coupled together, and are coupled to the gate of the p-channel transistor 902. In this manner, the operation of the source 202 biases the operation of the p-channel transistor 902. The p-channel transistor 902 regulates the current that is conducted by the resistor 906. An analog value representing the current conducted by the resistor 906 is input to an analog-to-digital (A/D) converter 908. The A/D converter 908 converts the analog value to a digital value. This digital value is output to a divider (e.g., divider 310).

Figure 10:
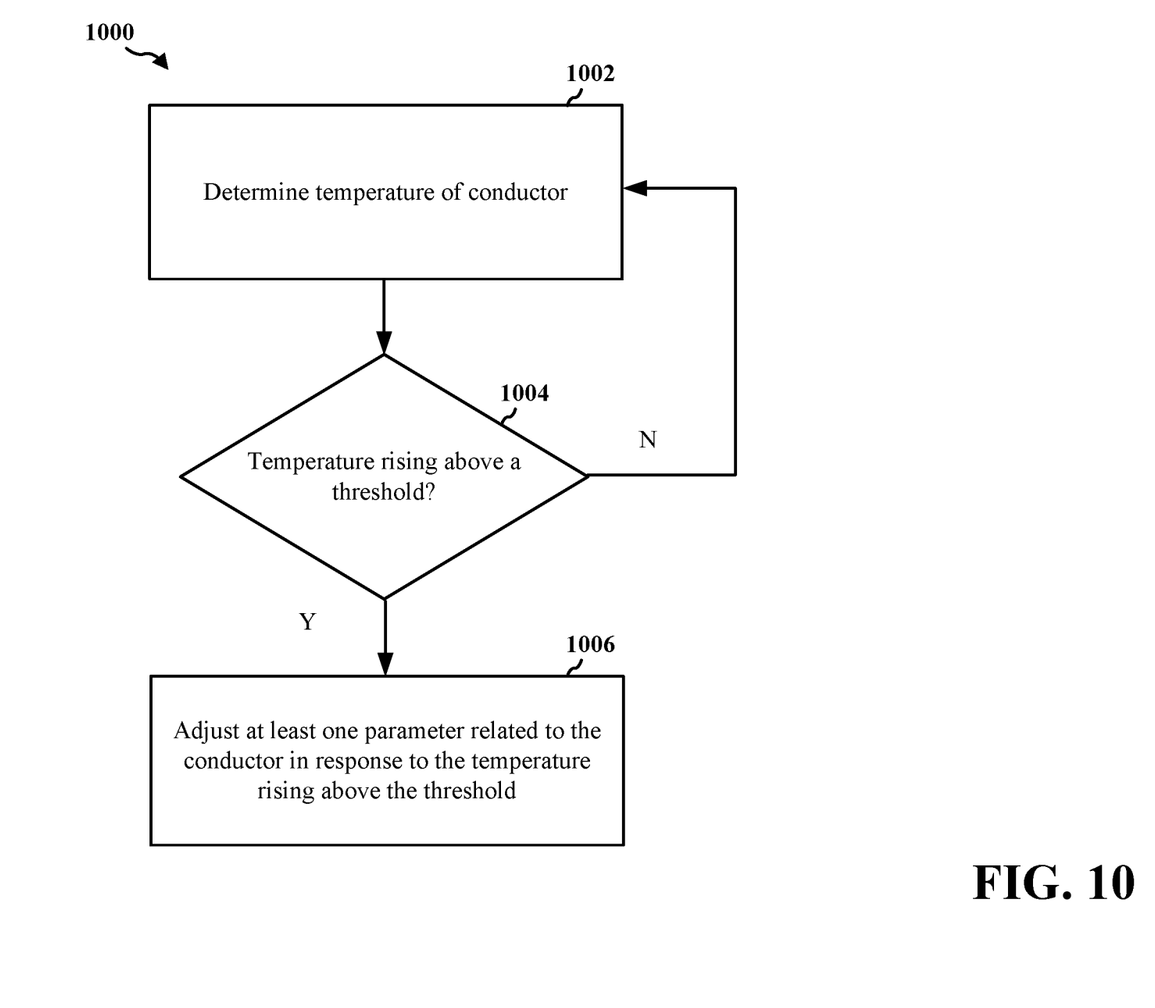
FIG. 10 is a flow diagram illustrating the operation of an exemplary embodiment of a processor.

FIG. 10 is a flow diagram illustrating the operation 1000 of an exemplary embodiment of a processor (e.g., processor 208). The processor performs monitoring and/or prevention functions.

Referring to FIG. 10, at 1002, the temperature of a conductor is determined. For example, as described earlier with reference to FIG. 3, the temperature module 302 determines the temperature of the conductor (e.g., conductor 206).

As a further example, the temperature may be determined by determining a resistance of the conductor, and the resistance may be determined based on a measured voltage across the conductor and a measured current flowing through the conductor. (See FIG. 3, 306, 308, 310.) The temperature may be determined based on the determined resistance. (See FIG. 3, 312.)

At 1004, it is determined whether the temperature is rising above a threshold. The threshold may be an allowable limit corresponding to the conductor.

If it is determined that the temperature is not rising above the threshold, the temperature of the conductor continues to be monitored (see, e.g., 1002).

At 1006, at least one parameter related to the conductor is adjusted in response to the determined temperature rising above the threshold. As described earlier with reference to FIG. 4, the one or more parameters may include an operating voltage of a portion of the circuit (e.g., a source or a sink). As described earlier with reference to FIG. 5, the one or more parameters may include an operating frequency of the portion of the circuit. As described earlier with reference to FIG. 6, the one or more parameters may include a lifetime estimate for the conductor.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented. The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims. For example, the steps may be implemented by circuits to perform the functions described herein and/or circuits generating the signals for the functions described herein, or combinations thereof.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for."

What is claimed is:

1. An apparatus, comprising:
   an integrated circuit;
   a conductor interconnecting a first element and a second element of a portion of the integrated circuit; and a processor configured to:
  determine a resistance of the conductor;
  determine a temperature of the conductor based on the determined resistance; and
  adjust at least one parameter related to the conductor in response to determining that the temperature is above a threshold, wherein the at least one parameter comprises a lifetime estimate for the conductor.

2. The apparatus of claim 1, wherein the processor is further configured to determine the resistance of the conductor by:
  measuring a voltage across the conductor;
  measuring a current through the conductor; and
  determining the resistance from the measured voltage and the measured current.

3. The apparatus of claim 2, further comprising a voltage-controlled oscillator (VCO), wherein the processor is further configured to measure the voltage with the VCO.

4. The apparatus of claim 1, wherein the at least one parameter further comprises at least one of an operating frequency or an operating voltage of the portion of the integrated circuit interconnected by the conductor.

5. The apparatus of claim 1, wherein the processor is further configured to adjust the at least one parameter by:
  determining a duration of time that the temperature is above the threshold; and
  adjusting the lifetime estimate based on the determined duration of time.

6. The apparatus of claim 5, wherein the processor is further configured to:
  determine whether the adjusted lifetime estimate is below a second threshold; and
  report information related to the adjusted lifetime estimate in response to the adjusted lifetime estimate being below the second threshold.

7. The apparatus of claim 5, wherein the processor is further configured to:
  provide information relating to the adjusted lifetime estimate to a display.

8. A method of operating an apparatus including an integrated circuit and a conductor interconnecting a first element and a second element of a portion of the integrated circuit, the method comprising:
  determining a resistance of the conductor
  determining a temperature of the conductor based on the determined resistance; and
  adjusting at least one parameter related to the conductor in response to determining that the temperature is above a threshold, wherein the at least one parameter comprises a lifetime estimate for the conductor.

9. The method of claim 8, wherein the determining the resistance of the conductor further comprises:
  measuring a voltage across the conductor;
  measuring a current through the conductor; and
  determining the resistance from the measured voltage and the measured current.

10. The method of claim 9, wherein the voltage across the conductor is measured with a voltage-controlled oscillator (VCO).

11. The method of claim 8, wherein the at least one parameter further comprises at least one of an operating frequency or an operating voltage of the portion of the integrated circuit interconnected by the conductor.

12. The method of claim 8, wherein the adjusting the at least one parameter comprises:
  determining a duration of time that the temperature is above the threshold; and
  adjusting the lifetime estimate based on the determined duration of time.

13. The method of claim 12, wherein the adjusting the at least one parameter further comprises:
  determining whether the adjusted lifetime estimate is below a second threshold; and
  reporting information related to the adjusted lifetime estimate in response to the adjusted lifetime estimate being below the second threshold.

14. The method of claim 12, wherein the adjusting the at least one parameter further comprises:
  providing information relating to the adjusted lifetime estimate to a display.

15. An apparatus comprising:
  an integrated circuit;
  a conductor interconnecting a first element and a second element of a portion of the integrated circuit, the conductor located in a layer separated from a substrate;
  means for determining a resistance of the conductor;
  means for determining a temperature of the conductor based on the determined resistance; and
  means for adjusting at least one parameter related to the conductor in response to determining that the temperature is above a threshold.

16. The apparatus of claim 15, wherein the means for determining a resistance comprises:
  means for measuring a voltage across the conductor;
  means for measuring a current through the conductor,
  wherein the means for determining the resistance determines the resistance from the measured voltage and the measured current, wherein the at least one parameter comprises a lifetime estimate for the conductor.

17. The apparatus of claim 16, wherein the means for measuring a voltage comprises a voltage-controlled oscillator (VCO).

18. The apparatus of claim 15, wherein the at least one parameter comprises at least one of an operating frequency or an operating voltage of the portion of the integrated circuit interconnected by the conductor.

19. The apparatus of claim 15, wherein the means for adjusting at least one parameter determines a duration of time that the temperature is above the threshold and adjusts the lifetime estimate based on the determined duration of time.

20. The apparatus of claim 19, wherein the means for adjusting at least one parameter further determines whether the adjusted lifetime estimate is below a second threshold and reports information related to the adjusted lifetime estimate in response to the adjusted lifetime estimate being below the second threshold.

21. The apparatus of claim 19, wherein the means for adjusting at least one parameter further provides information relating to the adjusted lifetime estimate to a display.

22. The apparatus of claim 1, wherein
  the conductor comprises a metal trace of the integrated circuit.

23. The method of claim 8, wherein,
  the conductor comprises a metal trace of the integrated circuit.

24. The apparatus of claim 15, wherein
  the conductor comprises a metal trace of the integrated circuit.

* * * * *